United States Patent [19]

Buder

[11] Patent Number: 5,884,232
[45] Date of Patent: Mar. 16, 1999

[54] COMPUTER PROGRAM FOR CALCULATING FASTENER FORCES

[76] Inventor: Daniel A. Buder, 23002 Felbar Ave., Torrance, Calif. 90505

[21] Appl. No.: 770,520

[22] Filed: Dec. 20, 1996

[51] Int. Cl.⁶ .................................. G01L 1/00; G01L 3/00
[52] U.S. Cl. ............................. 702/42; 364/512; 73/761; 73/862.043
[58] Field of Search ....................................... 364/508, 512; 73/847, 862.041, 862.042, 862.52, 862.24; 702/42; 52/283, 167.3, 167.4, 167.6, 167.8

[56] References Cited

U.S. PATENT DOCUMENTS

| | | | |
|---|---|---|---|
| 3,638,377 | 2/1972 | Caspe | 52/167.4 |
| 3,640,130 | 2/1972 | Spescha et al. | 73/862.043 |
| 3,664,077 | 5/1972 | Arnold | 52/283 |
| 3,939,920 | 2/1976 | Hardiman et al. | 173/1 |
| 4,662,217 | 5/1987 | Hafner | 73/147 |
| 4,858,146 | 8/1989 | Shebini | 364/512 |
| 5,342,138 | 8/1994 | Saito et al. | 403/189 |
| 5,343,785 | 9/1994 | Holt et al. | 81/57.38 |
| 5,375,382 | 12/1994 | Weidlinger | 52/167.3 |
| 5,591,919 | 1/1997 | Hathaway et al. | 73/761 |

OTHER PUBLICATIONS

MacNeal–Schwendler, "MacNeal Schwendler and NASA–Langley Sign Cooperative Agreement for Technology Transfer", News Release, Licensee & Sales Agreements, Jan. 5, 1995.

WESTCOM, "FASTENER–Fastener Strength Calculation Program", World–Wide–Web, 1–6, 1996.

Bill Williams, NASA Technology Opportunity, "Piping Stress Analysis Software", World–Wide–Web, 1–3, Aug. 1997.

HEXAGON, Kirchheim/Teck, "SR1 Bolt Calculation Software", World–Wide–Web, 1–7, 1993.

*Primary Examiner*—James P. Trammell
*Assistant Examiner*—Demetra R. Smith
*Attorney, Agent, or Firm*—Donald E. Stout

[57] ABSTRACT

A NASTRAN-programmed computer calculates force and moment data for a structure including joints of interest. The NASTRAN data is read by a computer programmed with the invented program. For each joint, the user selects the members which contribute forces to the joint, and also selects the nearest grid point. A computer programmed with the invented program calculates the resultant force and moment at the proximate grid point. The force and moment are originally defined in a global coordinate system, subsequently transformed into a local coordinate system, and then translated to the centroid of the joint's fastener pattern. Axial and shear forces for each fastener are calculated for the nominal case wherein all of the fasteners are operative. Furthermore, each fastener, in turn, is assumed not to transmit axial force and the resulting fail-safe axial forces respectively acting on the remaining operative fasteners are calculated. Fastener forces are screened to determine the critical nominal axial and shear forces, and the critical fasteners which transmit the foregoing critical forces; in addition to the critical fail-safe axial force and consonant critical fail-safe fastener.

26 Claims, 4 Drawing Sheets

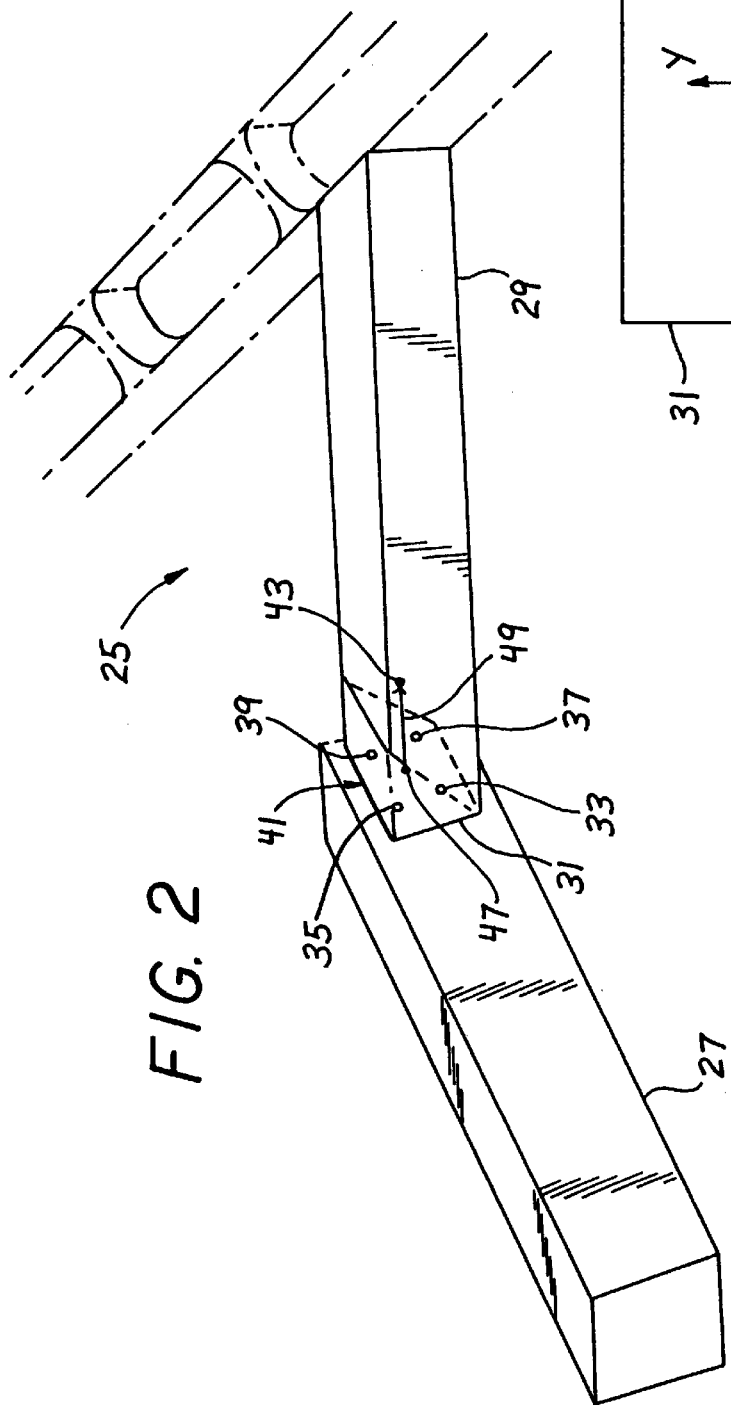
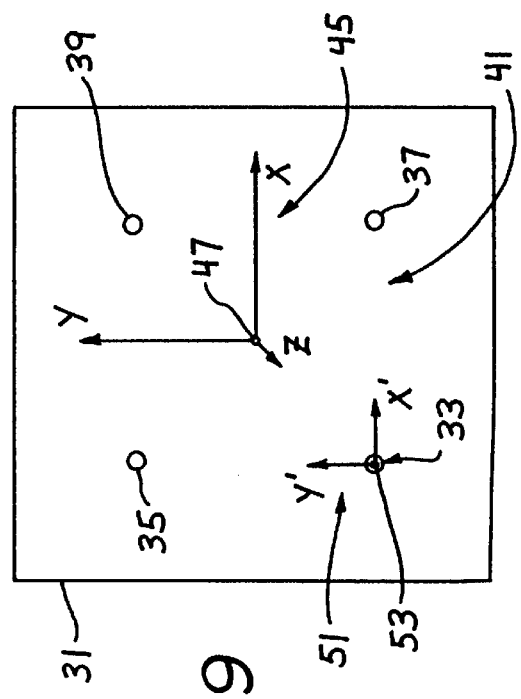

COMPUTER PROGRAM FOR CALCULATING FASTENER FORCES

The United States Governnent has a royalty free license for the practice of this invention as provided for by the terms of a contract awarded to the patent owner by an agency of the United States Government.

BACKGROUND

1. Field of the Invention

The present invention relates to a computer program for calculating the shear and axial forces on fasteners used to form structural joints and, more particularly, for predicting the highest force that will be applied to any of the fasteners comprising a joint when the structure is loaded, and for identifying the fastener that will transmit the foregoing highest force.

2. Description of the Prior Art

Structures are commonly constructed by using joints comprised of fasteners to attach load-bearing members such as beams and bars, to each other and to various functional components. The members are subjected to axial forces, shear forces and moments. In a simple structure, the foregoing parameters may be manually calculated by a structural engineer using well known analytical methods. However, such calculations are very time consuming when the structure is complex, or when the applied forces are dynamic and numerous cases must be considered during the design process.

Computer programs for use in conjunction with digital computers have been developed as an analytical aid for use in such situations. The NASTRAN computer program in particular has been found to be a valuable tool in the analysis of complex structures such as those used in flight vehicles. This program is well known and widely available to those practicing in the field of structural analysis.

The NASTRAN program allows the design engineer to subject the structure to a number of different load states, also known as subcases, and obtain the axial and shear forces and moment acting on each location of interest, also known as a grid point. The axial and shear forces and moments acting on the structural members are then derived from the forces and moments at the relevant grid points. For example, the NASTRAN program has been used to calculate the forces acting on a number of grid points on a flight vehicle for subcases consisting of different inertial loads. It also enables the designer to ascertain the respective changes in the forces at grid points when the structure is modified.

Moreover, the NASTRAN program can determine the forces acting on grid points caused by several structural components having differing natural frequencies, and thus reacting dissimilarly to acceleration. The NASTRAN program is quite useful in this regard because it provides for the creation of a file for each component, with each file having the same set of subcases for the desired acceleration states. The resultant force acting on each grid point is then obtained by superimposing the respective forces generated by each component, for each subcase.

Although structural analysis programs such as NASTRAN have proven to be invaluable in the structural design process, substantial calculations in addition to the computer-aided analysis must nonetheless be performed because structures typically are not modeled with the extreme amount of detail required to determine forces in individual fasteners. Furthermore, the computer programs of the prior art are unable to screen the numerous fastener forces for each subcase to determine which of such forces is the highest for each joint; or to deternmine which of the fasteners is transmitting the highest force, and thus is the most likely to fail.

In the absence of a computer program, engineers have calculated joint forces and designed fasteners for such joints using simplistic approaches which rely upon gross approximations. These prior art methods are time consuming, especially when the structure includes a large number of fasteners. Furthermore, the prior art methods typically result in conservative joint designs which most likely are stronger and thus weigh more than would be required by a more accurate analysis. On a structure including a large number of fasteners, the weight added by the inaccuracy of the prior art method is significant. When the structure is part of a propelled vehicle, such unnecessary weight degrades performance, decreases the payload, and increases fuel consumption.

The present invention is a computer program which, when used in conjunction with a compatible digital computer and the output of a structural analysis program such as NASTRAN, provides an accurate analysis of the axial and shear forces acting on the fasteners composing the joints of load-bearing members in a structure. It is substantially faster and more accurate than the simplistic methods of the prior art. It thus reduces the time necessary for analysis, while improving the reliability and reducing the weight of each fastener and its associated structure. Use of the present invention will thus provide a savings in the development cost of a structure, while also reducing its weight and improving its reliability.

SUMMARY OF THE INVENTION

Briefly, the invention is a computer program for determining the axial and shear forces acting on each fastener used to join load-bearing structural members together. In conjunction with the use of the NASTRAN computer program, or the like, a model of the structure of interest is first created by approximating its load-bearing members with representative finite elements. The NASTRAN-programmed computer then calculates the forces and moments which each finite element contributes to each of a plurality of grid points located throughout the structure.

The program user selects the finite elements corresponding to those members which contribute loads to the joints of interest, and also identifies the grid point nearest to each joint of interest. Based on this input, a computer programmed with the program of the present invention takes over further calculations, and first combines the forces and moments from the contributing elements to determine the resultant force and moment acting at each proximate grid point. Each resultant grid point force and moment is defined in a NASTRAN-generated global Cartesian coordinate system having its origin at its respective grid point. The resultant force and moment are then transformed into a local coordinate system located, at this intermediate stage, at the grid point.

The grid point is spaced apart from the centroid of the joint's fastener pattern by a linear offset. The axial and shear forces and moment at each joint are obtained by translating the resultant force and moment from the grid point to the pattern centroid. Axial and shear forces acting on each fastener of the joint are then calculated for the nominal case, that is, where all of the fasteners are assumed operative. In addition, the fail-safe cases are analyzed wherein each fastener is, in turn, assumed not to transmit an axial force and the axial forces respectively acting on the remaining, operative fasteners are calculated.

After all calculations have been performed, the fastener forces for each joint of interest are screened to determine the highest, also known as "critical", nominal axial force, the critical nominal shear force, and the respective "critical" fasteners which transmit the foregoing critical forces; and the critical fail-safe force and the consonant critical fastener. All of the subcases are reviewed, so that a critical force is the highest fastener force acting at a joint for all of the subcases.

BRIEF DESCRIPTION OF THE DRAWINGS

These and various other features and advantages of the present invention will be more clearly understood from the following detailed description thereof when read in conjunction with the accompanying drawings, in which:

FIG. 2 illustrates a structure including two members attached by a joint having its fastener forces calculated by the present invention;

FIG. 9 is a planar view of the joint of interest, wherein the fastener pattern, the pattern coordinate system, and the local coordinate system are shown;

FIG. 11 shows the global coordinate system, while

DETAILED DESCRIPTION OF THE INVENTION

Figure 1:
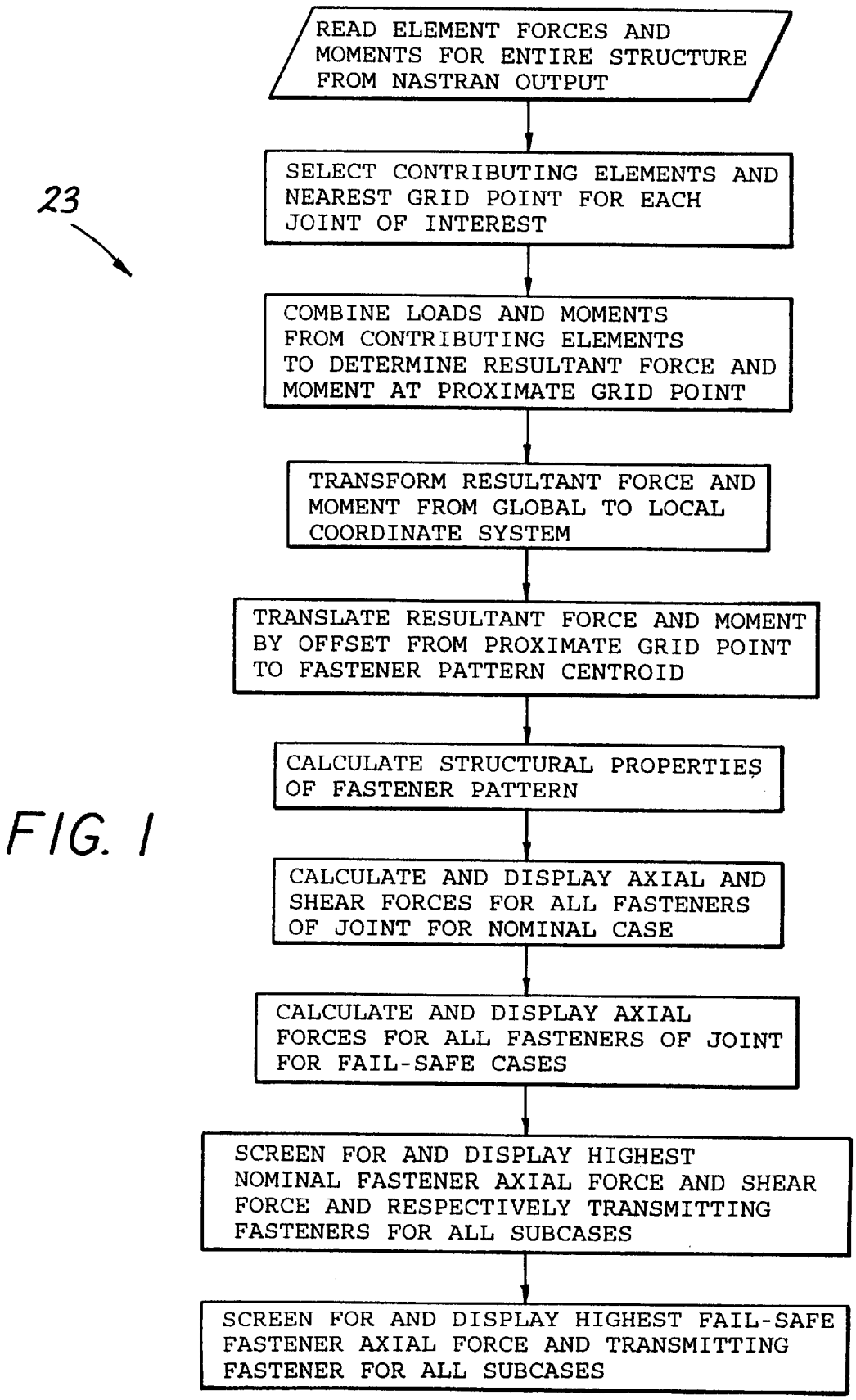
FIG. 1 is a flow chart of the computer program of the present invention.

FIG. 1 depicts a flow chart of computer program 23, which constitutes a preferred embodiment of the present invention. Computer program 23 is encoded in a computer-readable medium, and is intended to be used to program a digital computer to carry out the procedures hereinafter explained. In a presently preferred embodiment of the invention, the instructions comprising program 23 are coded in FORTRAN 77 source code, and are set out in an appendix which follows the specification.

In conjunction with the flow chart of FIG. 1, an illustrative use of program 23 is hereinafter described to facilitate an understanding thereof. An exemplary structure 25 is illustrated in FIG. 2. The part of structure 25 which is of interest is shown in solid lines, while the remainder of the structure is shown in phantom lines. Although the computer program of the present invention is quite capable of analyzing structures of extreme complexity, structure 25 has been kept simple in order to further assist understanding.

Structure 25 includes bars 27 and 29, which are attached by joint 31. Bolts 33, 35, 37 and 39 comprise the fasteners used in forming joint 31. The aforementioned bolts form pattern 41 and become operative when they are inserted into joint 31 and secured with nuts.

The NASTRAN structural analysis program is first used to ascertain the axial and shear forces and moments for all of the members of structure 25. Although the NASTRAN program is used in the example and is typically used in conjunction with computer program 23, any structural analysis program or means of structural analysis may similarly be employed to determine the forces and moments of the subject structure. Program 23 reads all of the files generated by the NASTRAN-programmed computer. This is necessary because, while each file contains the forces and moments for all the members for all of the subcases, any one file includes only the forces and moments caused by a singular component attached to the structure. The data from all of the files is thus necessary to determine the effect of all of the components.

The commands to read the NASTRAN files are input into the computer in the following format, wherein the rectangular boxes represent the input fields in lines of a computer-readable file or on computer-readable cards. The fields are eight characters wide, with the exception of file names, which may be a maximum of eighty characters wide. Comments are preceded by a "$".

| $ INPUT F06 FILES | |
|---|---|
| $F06 FILE NAME | |
| F06 | TEST.F06 |
| F06 | TEST2.F06 | wherein:

F06 refers to the output of the NASTRAN-programmed computer; and

TEST.F06 and TEST2.F06 refer to the output files generated by the NASTRAN-programmed computer for structure 25 and named by the user of the NASTRAN program.

For each joint of interest the user of the computer program of the present invention examines the structure and selects the members connected to the joint which contribute to the force and moment acting at the joint. For each member, the user specifies the type of element from among the six listed below. The six element types are illustrated in FIGS. 3 through 8, as noted.

Figure 3:
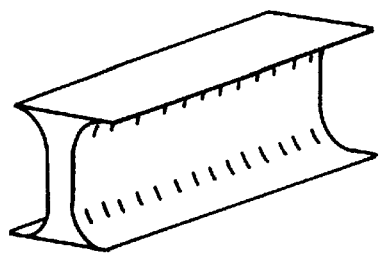
FIGS. 3 through 8 show different types of structural elements used in finite element analysis.

BAR, FIG. 3: a longitudinal element having a constant lateral cross-section.

Figure 4:
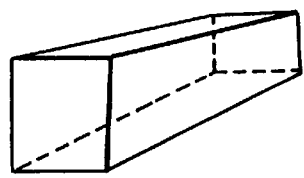

BEAM, FIG. 4: a longitudinal element whose lateral cross-section may vary, e. g., taper.

Figure 5:
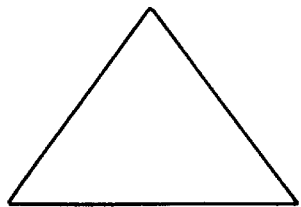

TRIA, FIG. 5: a triangular planar element.

Figure 6:
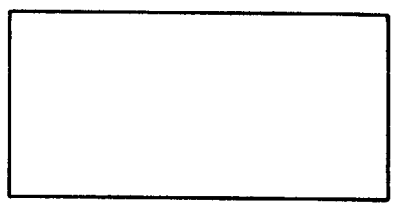

QUAD, FIG. 6: a quadrilateral planar element.

Figure 7:
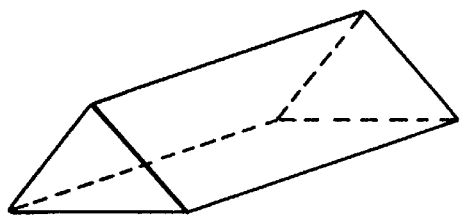

PENT, FIG. 7: a five sided solid element having a triangular lateral cross-section.

Figure 8:
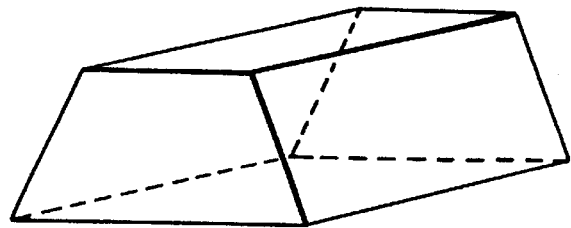

HEXA, FIG. 8: a six sided solid element having a quadrilateral lateral cross-section.

For the illustrative example, joint 31 of structure 25 is the joint of interest. Bars 27 and 29 are connected by joint 31, and thus are the contributing elements. In order to perform the NASTRAN analysis, a mathematical model of structure 25 is set up wherein each member is approximated by a finite element, and each element is assigned an identifying number. The NASTRAN element identification convention is used by program 23. Bar 27 is identified by element number 274291 and bar 29 by element number 274292. The aforementioned elements are input into the computer in the following format:

| $ELEM TYPE | ELEM ID |
|---|---|
| BAR | 274291 |
| BAR | 274292 |

Preliminary to determine the force and moment acting on each element, the NASTRAN program calculates the forces and moments at various grid points located throughout the structure. As is the case with elements, all of the grid points are assigned identifying numbers pursuant to running the NASTRAN program, and the NASTRAN grid point identification convention is used by program 23.

For each joint of interest, the user of program 23 must select the nearest grid point. For joint 31, grid point 43 having NASTRAN identification number 274290 is the closest grid point. This selection is input in the following format:

| $JOINT | JOINT ID | GRID ID | NEL | PAT ID |
|---|---|---|---|---|
| JOINT | 1 | 274290 | 2 | 1 | wherein:
NEL refers to the number of elements contributing loads to the joint; and
JOINT ID and PAT ID are identifying numbers designated by the user of program 23 to respectively identify joint 31 and fastener pattern 41.

Several joints may have the identical fastener pattern. The PAT ID would be the same for these joints and, as will be subsequently discussed, so would the physical parameters associated with the fastener pattern.

Given the foregoing information, program 23 superimposes the relevant NASTRAN files to determine the resultant force and moment acting on each contributing element i.e., bars 27 and 29, for each subcase. The resultant force and moment at the grid point of interest, i.e., grid point 43, are then calculated by program 23 by combining the loads and moments contributed by bars 27 and 29, using analytical methods well known to those skilled in the art of structural analysis.

The force and moment at grid point 43 are defined in the NASTRAN Cartesian coordinate system herein identified as global coordinate system 44. Program 23 next transforms the force and moment so that they are defined in terms of local Cartesian coordinate system 45.

FIG. 9 shows local coordinate system 45 located at joint 31, and also provides a planar view of pattern 41. The origin of local coordinate system 45 lies at centroid 47 of fastener pattern 41. Oftentimes, as is the case for pattern 41, the location of the centroid is obvious upon inspection of the fastener pattern. However, if the fasteners are of differing diameters or sizes, or if the fastener pattern is asymmetrical, a calculation may be necessary. The method for calculating the location of the pattern centroid is well known to those skilled in structural analysis.

The x and y axes of local coordinate system 45 lie in the plane of joint 31. The x and y axes may be canted relative to the fastener pattern at the discretion of the user. In the present example, they have been symmetrically positioned relative to fastener pattern 41. The z axis lies perpendicular to the plane of joint 31.

The angular transformation of the force and moment from global coordinate system 44 to local coordinate system 45 requires the user to determine and input three orthogonal angles of rotation necessary to align the axes of global coordinate system 44 with those of local coordinate system 45. The transformation rotation angles are obtained by placing both coordinate systems 44 and 45 at a common origin and then rotating global coordinate system 44 about its axes so that the axes become aligned with the corresponding axes of local coordinate system 45.

Figure 10:
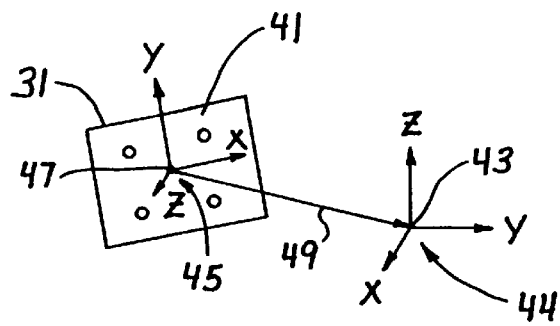
FIG. 10 shows the global coordinate system located at a grid point and the local coordinate system located at the joint of interest.
Figure 11:
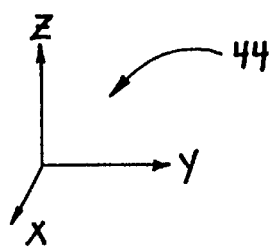
Figure 12:
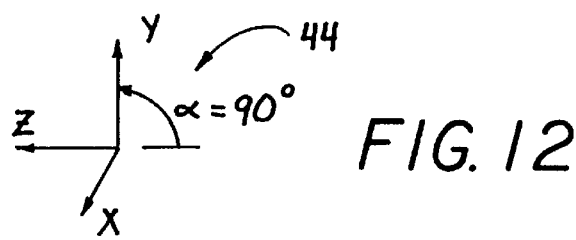
FIGS. 12, 13, and 14 show the sequence of rotation and the respective angles of rotation of the global coordinate system about its axes required to align the global axes with the axes of the local coordinate system.
Figure 13:
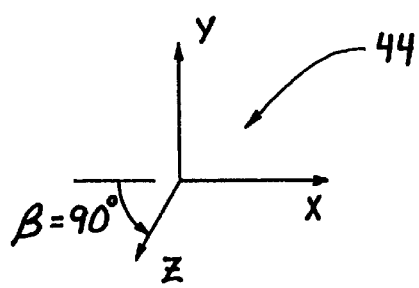
Figure 14:
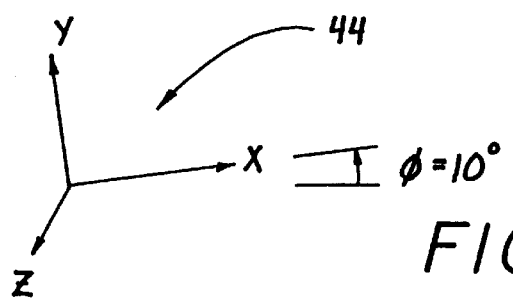

FIG. 10 shows global coordinate system 44 having its origin at grid point 43, and local coordinate system 45 having its origin at centroid 47 of fastener pattern 41. FIG. 11 shows global coordinate system 44. FIGS. 12 through 14 show the order in which global coordinate system 44 must be respectively rotated about its axes to obtain the transformation angles.

More particularly, as shown in FIG. 12, global coordinate system 44 is first rotated about is x axis until its y axis is vertical. In this case, the x rotation angle, $\alpha$, is 90°. As shown in FIG. 13, global coordinate system 44 is next rotated about its y axis until its z axis is aligned with the z axis of local coordinate system 45. In this case, the y rotation angle, $\beta$, is 90°. As shown in FIG. 14, global coordinate system 44 is finally rotated about its z axis until the x and y axes of global coordinate system 44 are aligned with the x and y axes of local coordinate system 45. In this case, the z rotation angle, $\phi$, is 10°.

The foregoing rotation angles are input in the following format:

| $ANGLE | $\alpha$ | $\beta$ | $\phi$ |
|---|---|---|---|
| ANGLE | 90.0 | 90.0 | 10.0 |

Grid point 43 is spaced apart from pattern centroid 47 by linear offset 49. Offset 49 is a vector from centroid 47 to grid point 43, and is expressed in the coordinates of local coordinate system 45. The Cartesian coordinates for offset 49 are input in the following format:

| $OFFSET | OFFSET x | OFFSET y | OFFSET z |
|---|---|---|---|
| OFFSET | 1.0 | −2.0 | 0.5 |

The force and moment at grid point 43, transformed from global coordinate system 44 to local system 45, are then translated from grid point 43 to pattern centroid 47. More particularly, the force vector remains the same, whereas the moment vector is changed in accordance with the equation $$\vec{M}_l = \vec{M}_g + \vec{O} \times \vec{F}$$

wherein:
$\vec{M}_l$ is the local moment vector at pattern centroid 47;
$\vec{M}_g$ is the transformed moment vector at grid point 43;
$\vec{O}$ is the vector for offset 49; and
$\vec{F}$ is the transformed resultant force vector at grid point 43.

The bolt pattern data is input by the user. Bolt pattern 41 and pattern Cartesian coordinate system 51 are shown in FIG. 9. Pattern coordinate system 51 is used to define the location of the fasteners relative to each other. Origin 53 is the origin of pattern coordinate system 51. Origin 53 lies coincident with bolt 33. The diameter, D, of each bolt of pattern 41 is also input.

The user must indicate whether, due to the fit of each bolt in its bore relative to the fits of the other bolts, each bolt transmits or does not transmit a shear force in the xy plane. A bolt will transmit shear when its fit is no looser than the fit of any other bolt in the pattern, that is, when its bolt-to-bore clearance tolerance is no greater than the clearance tolerance of any other bolt in the pattern. The foregoing shear transmitting condition is indicated by leaving the NOSHEAR field blank Consonantly, a bolt will not transmit shear loading when its fit is looser, that is, when its bolt-to-bore clearance is greater, than any of the other bolts in the pattern. This alternative condition is signaled by entering NOSHEAR in the NOSHEAR field.

The bolt locations, bolt diameters, and shear force transmission are input in the following format:

| $ FIRST CARD PATTERN ID AND NUMBER OF BOLTS | | | |
|---|---|---|---|
| $ SUBSEQUENT CARDS x¢, y¢, D, NOSHEAR for each bolt in a given pattern | | | |
| $ PAT | PAT ID | # BOLTS | |
| PAT | 1 | 4 | |
| $x¢ | y¢ | D | NOSHEAR |
| 0.000 | 0.000 | 0.188 | |
| 0.000 | 0.750 | 0.188 | NOSHEAR |
| 1.000 | 0.000 | 0.188 | NOSHEAR |
| 1.000 | 0.750 | 0.188 | | wherein:
PAT ID refers to the identifying number designated by the program user for pattern 41; and x¢ and y¢ respectively refer to the abscissa and ordinate of each bolt location in pattern coordinate system 53.

Program 23 will subsequently identify the bolts in output data displays by the numerical order in which the data for each bolt is input in this format. Thus, bolt 1 (bolt 33 in FIG. 9) is the bolt described by the first line; bolt 2 (bolt 35 in FIG. 9) is described by the second line; bolt 3 (bolt 37 in FIG. 9) is described by the third line; and bolt 4 (bolt 39 in FIG. 9) is described by the fourth line.

Based on the foregoing fastener pattern data, a computer programmed with program 23 determines and prints out the following structural properties of fastener pattern 41 as a preliminary step to calculating the forces acting on the bolts. The first line of parameters is used in the axial force calculations, while the second line is used in the shear force calculations. Both the first and second lines are for the nominal case where all four bolts are assumed to be operatively inserted and thus capable of transmitting force.

The third through sixth lines are for fail-safe calculations, wherein it is assumed that a specified bolt, BOLTOUT, has failed or is otherwise inoperative and thus is transmitting none of the axial force acting on joint 31. The fail-safe cases affect only the axial forces acting on the remaining three bolts.

| A | Ix | Iy | Ixy | Cx | Cy | IO | Ixy–Ixy2 |
|---|---|---|---|---|---|---|---|
| 1.11E-01 | 1.56E-02 | 2.78E-02 | 0.00E+00 | 5.00E-01 | 3.75E-01 | 4.34E-02 | 4.33E-04 |
| PROPERTIES FOR SHEAR FORCE CALCULATIONS ONLY: | | | | | | | |
| 5.55E-02 | 7.81E-03 | 1.39E-02 | 1.04E-02 | 5.00E-01 | 3.75E-01 | 2.17E-02 | 7.28E-12 |

FAILSAFE BOLT PATTERN SECTION PROPERTIES:

| BOLT | A | Ix | Iy | Ixy | Cx | Cy | IO | Ixy-Ixy2 |
|---|---|---|---|---|---|---|---|---|
| 1 | 8.33E-02 | 1.04E-02 | 1.85E-02 | –6.94E-03 | 6.67E-01 | 5.00E-01 | 2.89E-02 | 1.44E-04 |
| 2 | 8.33E-02 | 1.04E-02 | 1.85E-02 | 6.94E-03 | 6.67E-01 | 2.50E-01 | 2.89E-02 | 1.44E-04 |
| 3 | 8.33E-02 | 1.04E-02 | 1.85E-02 | 6.94E-03 | 3.33E-01 | 5.00E-01 | 2.89E-02 | 1.44E-04 |
| 4 | 8.33E-02 | 1.04E-02 | 1.85E-02 | –6.94E-03 | 3.33E-01 | 2.50E-01 | 2.89E-02 | 1.44E-04 | wherein:
A is the total cross sectional area of all of the bolts of pattern 41;

Ix is the moment of inertia of pattern 41 about the x axis of local coordinate system 45;

Iy is the moment of inertia of pattern 41 about the y axis of local coordinate system 45;

Ixy is the product of the moments of inertia of pattern 41 about the x and y axes of local coordinate system 45;

Cx is the distance along the x¢ axis of pattern coordinate system 51, from pattern origin 53 to the pattern centroid;

Cy is the distance along the y¢ axis of pattern coordinate system 51, from pattern origin 53 to the pattern centroid;

IO is the polar moment of inertia of pattern 41 about the z axis of local coordinate system 45; and Ixy-Ixy2 is the difference between the product of the moments of inertia of pattern 41 about the x and y axes of local coordinate system 45, and the square of the foregoing moment product.

The bolts that do not transmit shear force do not contribute to the shear force carrying capability of the joint. Thus the total cross-sectional area, A, used in the shear force calculations for joint 31 is half that of its total area, A, used in the axial force calculations, with consonant changes in the inertial parameters. Similarly, the total cross-sectional area, A, for each of the fail-safe cases in which only three of the four bolts transmit an axial load, is only three-fours of the total area, A, for four bolts.

For each different BOLTOUT, the Cx and Cy parameters change because the location of the pattern centroid is determined by the operative bolts. Both distances thus change depending upon the location of the bolt that is not operative.

The fastener pattern parameters, i.e., bolt locations, bolt diameters, and shear transmission, may be identical for a number of joints. The pattern identification number would remain the same for such joints, and the computer programmed with program 23 would automatically use the same pattern properties for the respective fastener force calculations.

Program 23 provides both a detailed and a summary display of output data The OUT2 file provides a detailed, unabridged display of calculated forces and moments, for every subcase. The command to obtain the detailed output data display is input in the following format:

| $OUT | FILE NAME |
|---|---|
| OUT2 | TEST.OUT2 | wherein:

OUT2 is the command, and TEST.OUT2 is the file name designated by the user of program 23 to identify the file composed of the detailed fastener forces and moments.

The output provided by OUT2 is shown for one subcase for joint 31. The following three lines provide, respectively, the component loads and moments:

1. at grid point 43 in global coordinate system 44;
2. at grid point 43 after transformation to local coordinate system 45; and
3. at pattern centroid 47, after transformation to local coordinate system 45 and translation by offset 49.

| CASE | GRID | Fx | Fy | Fz | Mx | My | Mz |
|---|---|---|---|---|---|---|---|
| SUB-CASE 1 | 274290 | −66.79 | −113.22 | 26.51 | 1551.61 | −56.28 | 4.93 |
| SUB-CASE 1 | 274290 | −83.55 | 26.51 | −101.48 | −583.57 | 4.93 | 1438.79 |
| SUB-CASE 1 | 274290 | −83.55 | 26.51 | −101.48 | −393.86 | 64.64 | 1298.2 | wherein:

CASE refers to the subcase;

GRID is grid point 43, the grid point nearest to joint 31;

Fx, Fy, and Fz are the orthogonal components of the resultant load; and

Mx, My, Mz are the orthogonal components of the resultant moment.

Note that only the components of the moment are affected by translation of the resultant force and moment by offset 49.

The next four lines show the forces at each bolt for the nominal case, i.e., wherein all four bolts are operative. It is followed by the fail-safe case, wherein each bolt, one at a time, is assumed to transmit no axial force, i.e., it is not operative. The axial force on each bolt of the remaining operative bolts in pattern 41 is presented. Note that the axial force for the inoperative bolt is zero.

| NOMINAL CASE BOLT LOADS | | | | | |
|---|---|---|---|---|---|
| JOINT-GRID | BOLT | Vx | Vy | Vr | P |
| 1-274290 | 1 | 581.36 | −817.59 | 1003.21 | 269.52 |
| 1-274290 | 2 | 0.00 | 0.00 | 0.00 | −255.63 |
| 1-274290 | 3 | 0.00 | 0.00 | 0.00 | 204.88 |
| 1-274290 | 4 | −664.91 | 844.10 | 1074.53 | −320.26 |

| FAILSAFE CASE BOLT LOADS | | | |
|---|---|---|---|
| JOINT-GRID | BOLT | BOLT OUT | P |
| 1-274290 | 1 | 1 | 0.00 |
| 1-274290 | 1 | 2 | 13.89 |
| 1-274290 | 1 | 3 | 474.41 |
| 1-274290 | 1 | 4 | 589.78 |
| 1-274290 | 2 | 1 | 13.89 |
| 1-274290 | 2 | 2 | 0.00 |
| 1-274290 | 2 | 3 | −460.51 |
| 1-274290 | 2 | 4 | −575.89 |
| 1-274290 | 3 | 1 | 474.41 |
| 1-274290 | 3 | 2 | 460.51 |
| 1-274290 | 3 | 3 | 0.00 |
| 1-274290 | 3 | 4 | −115.38 |
| 1-274290 | 4 | 1 | −589.78 |
| 1-274290 | 4 | 2 | −575.89 |
| 1-274290 | 4 | 3 | −115.38 |
| 1-274290 | 4 | 4 | 0.00 | wherein:

JOINT refers to the joint identification number for joint 31 designated by the program user;

GRID refers to the NASTRAN identification number for grid point 43;

$V_x$ and $V_y$ are the orthogonal components of the shear load, in local coordinate system 45;

$V_r$ is the resultant shear load, equal to the square root of the sum of the square of $V_x$ and the square of $V_y$; and P is the axial load, with a positive number indicating that the bolt is in tension, and a negative number indicating compression.

The OUT display screens the detailed and comprehensive data calculated by program 23, and presents only the critical forces, the bolt transmitting each critical force, and the responsible subcases. The command to obtain the summary display is input in the following format:

| $OUT | FILE NAME |
|---|---|
| OUT | TEST.OUT | wherein:

OUT is the command; and

TEST.OUT is the file name designated by the user.

The first two lines of the OUT display, set out below, respectively present the highest axial and shear loads acting on any bolt in joint 31 for the nominal (four operative bolt) case.

| JOINT-GRID | CRITICAL SUBCASE | BOLT | CRITICAL P and V | Fx | Fy | Fz | Mx | My | Mz |
|---|---|---|---|---|---|---|---|---|---|
| 1-274290 | SUBCASE 3 | 4 | P = 416.7 | −80.0 | 109.0 | −104.0 | −541.0 | 60.0 | 1692.0 |
| 1-274290 | SUBCASE 3 | 4 | V = 1421.3 | −80.0 | 109.0 | −104.0 | −541.0 | 60.0 | 1692.0 | wherein:

JOINT refers to the identification number of the joint of interest, joint 31;

GRID refers to the NASTRAN identification number for grid point 43;

CRITICAL SUBCASE is the subcase causing the critical (highest) axial or shear load in any of the bolts comprising joint 31;

BOLT is the bolt transmitting the critical force;

CRITICAL P and V shows the critical axial force, P (first line), and critical shear force, V (second line), acting on any bolt of joint 31;

Fx, Fy and Fz are the x, y and z components, respectively, of the resultant force acting on joint 31, defined in local coordinate system 45, for the critical subcase; and Mx, My, and Mz are the x, y, and z components, respectively, of the resultant moment acting on joint 31, in local coordinate system 45, for the critical subcase.

The next output line provides the highest axial load for any bolt in joint 31, for any fail-safe case.

| JOINT-GRID | CRITICAL SUBCASE | BOLT | BOLT OUT | CRITICAL P | Fx | Fy | Fz | Mx | My | Mz |
|---|---|---|---|---|---|---|---|---|---|---|
| 1-274290 | SUBCASE 8 | 4 | 2 | P = 805.0 | 44 | −195 | 53 | 584 | −14 | −1629 | wherein:

BOLT OUT indicates the inoperative bolt.

Program 23 has been used to program a VAX model computer manufactured by Digital Equipment Corporation.

Program 23 could also be used to program any suitable conventional computer system. It would be a routine matter to a person of ordinary skill in the pertinent art to select an appropriate computer system and implement on that computer system the method of the present invention. It should be clearly understood that the present invention encompasses both program 23 and a computer system having program 23 installed therein.

The following limitations have been incorporated into program 23. These limitations by no means limit the scope of the invention, and may be modified in other embodiments to suit particular applications.

Number of F06 files used to combine loads: 30
Number of subcases per F06 file: 98
Number of bolt patterns: 100
Number of bolts in a bolt pattern: 16
Number of joints: 100

The foregoing embodiment is one example of the present invention, and does not define the scope of the invention. The scope and breadth of the invention are defined and limited only by the appended claims.

19

Appendix

```
File BANG.FOR

PROGRAM BANG

INCLUDE 'BANGCOMMON.FOR'

CALL LIB$ERASE_PAGE(1,1)

DO 100 IFL=1,30

100     FIXX(IFL)='                                    '

CALL OPENFILE

CALL LIB$ERASE_PAGE(1,1)

CALL BOLT

LOG='N'

IF(LOG .EQ. 'N'.OR.LOG .EQ. 'n') THEN

CLOSE (UNIT=50,STATUS='DELETE')

ENDIF

STOP '  '

END

SUBROUTINE OPENFILE

INCLUDE 'BANGCOMMON.FOR'

33      TYPE 304

304     FORMAT(/,' ENTER JOINT DATA FILE NAME -- ',$)
```

```
                                  20
      READ(5,'(A80)')GEOF

OPEN (UNIT=97,FILE=GEOF,SHARED,READONLY,STATUS='OLD',ERR=32)

CALL OPEN2

NF=13

IF (IF6 .EQ. 1)GOTO 370

IF (IC .EQ. 1) THEN

28    TYPE 309

309   FORMAT(' Enter NASTRAN output file name -- ',$)

READ(5,'(A80)')FT07

OPEN (UNIT=13,FILE=FT07,SHARED,READONLY,STATUS='OLD',ERR= 27)

10    continue

WRITE(6,100)FT07

100   FORMAT(//,' Enter next NASTRAN.f06 that to be added to ',A80/
     .       ' (or press <Enter> to continue if none)'/)

temp=' '

READ(5,'(A80)')temp

IF(temp(1:2) .NE. ' ') THEN ft17=temp

NF=NF+1

WRITE(50,*)' ',NF,' IS ',FT17
```

21

```
      FIXX(NF-13)=FT17

OPEN (UNIT=NF,FILE=FT17,SHARED,READONLY,STATUS='OLD',ERR=
14)
      goto 10

14    write(6,*) ' ....... invalid file name ...... try again' goto 10

ENDIF

NCMX=1

ENDIF

370   CONTINUE

RESP='N'

FORCE='N'

DOT = '.'

OBRKT = '['

CBRKT = ']'

323   DO I = 1,80

FT11 = FT07(I:I)

IF (FT11.EQ.OBRKT) THEN

DO J = I+1,80

FT11 = FT07(J:J)

IF (FT11.EQ.CBRKT) THEN
```

```
                         22
             K = J+1

GOTO 325

ENDIF

END DO

ENDIF

END DO

325  IF(K.EQ.0)K=1

DO 328 I = K,80

FT11 = FT07(I:I)

FLEN = I-K+1

IF (FLEN.GT.40) THEN

TYPE *,'     *** FATAL ERROR ***'

TYPE *,'   FILENAME EXCEEDS 40 CHARACTERS  '

STOP

ENDIF

IF(FT11.EQ.DOT) GOTO 330

IF(FT11.EQ.' ') GOTO 330

FT12 = FT12(1:FLEN)//FT11

328  CONTINUE

330  FT12 = FT12(1:FLEN)// '.OUT'
```

```
        FT16 = FT12(1:FLEN)// '.OUT2'

FT19 = FT12(1:FLEN)// '.FORCE'

WRITE(50,*)'  FT07 IS ',FT07

FT20 = FT12(1:FLEN)// '.LOG'

IF(IF1.EQ.1)GOTO 371

OPEN (UNIT=8,FILE=FT12,
     .        STATUS='NEW',SHARED,CARRIAGECONTROL='FORTRAN')
371     CONTINUE

IF(IF2.EQ.1)GOTO 372

OPEN (UNIT=12,FILE=FT16,
     .        STATUS='NEW',SHARED,CARRIAGECONTROL='FORTRAN')
372     CONTINUE

GOTO 48

27      TYPE *,'   -- Invalid NASTRAN Output File Name --   '

TYPE *

GOTO 28

32      TYPE *,'   -- Invalid File Name --   '

TYPE *

GOTO 33

48      RETURN
```

24

```
            END

SUBROUTINE BOLT

INCLUDE 'BANGCOMMON.FOR'

NCN=0

NB=0

NP=0

TYPE *,'    '

TYPE *,'    '

TYPE *,'       ***** CALCULATING PATTERN PROPERTIES *****'

I=0

DO 70 KD=1,10000

99          FORMAT(A80)

READ(97,99,END=200)REC

IF (REC(1:1) .EQ. '$' .OR.
         .      REC(1:80) .EQ. ' ') GOTO 70

IF(REC(1:1).EQ.'$')GOTO 70

IF(REC(1:3).EQ.'PAT')THEN

READ(REC(9:24),137,ERR=999)IBP,IRX

137         FORMAT(BN,2I8)

IF(IBP.GT.NP)NP=IBP
```

```
                          25
       PATN(IBP,1)=IRX

DO 120 J=1,INT(PATN(IBP,1))

READ(97,135,END=200)(PATF(NP,J,K),K=1,3),SH

IF(INDEX(SH,'NOSHEAR').GT.0)THEN

PATF(NP,J,14)=0.

ELSE

PATF(NP,J,14)=1.

ENDIF

135    FORMAT(3F8.3,A7)

120    CONTINUE

ELSEIF(REC(1:5).EQ.'JOINT')THEN

READ(REC,100)JID

WRITE(50,100)JID

100    FORMAT(BN,8X,I8)

READ(REC,110)JTDA(JID,1,1),NELJ,JTDA(JID,1,2)

110    FORMAT(BN,16X,3I8)

DO 143 IIZ2=1,2

144    CONTINUE

READ(97,99)REC

IF(REC(1:5).EQ.'ANGLE')THEN
```

```
                                26
        READ(REC,140)(ANG(JID,I),I=1,3)

140     FORMAT(BN,8X,3F8.3)

ELSEIF(REC(1:6).EQ.'OFFSET')THEN

READ(REC,140)(OFF(JID,I),I=1,3)

ELSEIF(REC(1:1).EQ.'$')THEN

GOTO 144

ELSE

BACKSPACE 97

ENDIF

143     CONTINUE

141     FORMAT(BN,16X,3I8,6F8.3)

DO 150 IEL=2,NELJ+1

113     CONTINUE

READ(97,99)REC

IF (REC(1:1) .EQ. '$')GOTO 113

WRITE(50,*)REC

READ(REC,115)ET,JTDA(JID,IEL,1)

115     FORMAT(BN,A8,I8)

JTDA(JID,IEL,2)=0

DO 201 I=1,5
```

27

```
      IF(ET(I:I+2).EQ.'BAR')JTDA(JID,IEL,2)=1

IF(ET(I:I+3).EQ.'BEAM')JTDA(JID,IEL,2)=2

IF(ET(I:I+3).EQ.'QUAD')JTDA(JID,IEL,2)=3

IF(ET(I:I+3).EQ.'TRIA')JTDA(JID,IEL,2)=4

IF(ET(I:I+3).EQ.'HEXA')JTDA(JID,IEL,2)=5

IF(ET(I:I+3).EQ.'PENT')JTDA(JID,IEL,2)=6

IF(ET(I:I+2).EQ.'APP')THEN

JTDA(JID,IEL,2)=10

JTDA(JID,IEL,1)=-1

ENDIF

IF(ET(I:I+3).EQ.'TOTA')THEN

JTDA(JID,IEL,2)=11

JTDA(JID,IEL,1)=-2

ENDIF

201   CONTINUE

IF(JTDA(JID,IEL,2).EQ.0)THEN

WRITE(50,*)' UNKNOWN ELEM ON CARD:',REC

STOP

ELSE

WRITE(50,*)' ET=',ET,' IEL=',IEL,' ELTYPE IS
      ',JTDA(JID,IEL,2)
```

28
```
      ENDIF

150   CONTINUE

ELSEIF(REC(1:5).EQ.'OUT  ')THEN

ELSEIF(REC(1:5).EQ.'OUT2 ')THEN

ELSEIF(REC(1:5).EQ.'F06  ')THEN

ELSEIF(REC(1:5).EQ.'FBR  ')THEN

ELSEIF(REC(1:5).EQ.'GRID ')THEN

ELSE

WRITE(6,*)' UNRECOGNIZED CARD FOUND IN INPUT '

WRITE(6,*)REC

STOP

ENDIF

70    CONTINUE

200   CONTINUE

DO 75 JID=1,100

IF(JTDA(JID,1,1).NE.0) THEN

CALL TRANSFORM

ENDIF

75    CONTINUE

CALL PATTERN
```

29
```
      WRITE(8,*)

WRITE(8,*)' PROPERTIES OF THE BOLT PATTERNS'

WRITE(8,*)' -------------------------------'

DO 300 I=1,NP

WRITE(8,*)

WRITE(8,*)' FOR BOLT PATTERN ',I,' # BOLTS=',INT(PATN(I,1))

DO 305 J=1,PATN(I,1)

IF(PATF(I,J,14).EQ.1.)SH='SHEAR  '

IF(PATF(I,J,14).EQ.0.)SH='NOSHEAR'

WRITE(8,308)(PATF(I,J,K),K=1,3),SH

308   FORMAT(' X=',F7.3,' Y=',F7.3,' D=',F5.3,2X,A7)

305   CONTINUE

WRITE(08,*)

WRITE(08,410)

410   FORMAT(T12,'A',T22,'IX',T32,'IY',T42,'IXY'
     1,T52,'XC',T62,'YC',T72,'IO',T82,'IXIY-IXY2')

WRITE(08,510)(PATN(I,J),J=2,9)

WRITE(8,*)' PROPERTIES FOR SHEAR CALCULATIONS ONLY:'

WRITE(08,510)(PATS(I,J),J=2,9)

510   FORMAT(T12,8(1PE9.2,1X))
```

30

```
       WRITE(08,*)' '

WRITE(08,*)' FAILSAFE BOLT PATTERN SECTION PROPERTIES:'

WRITE(08,610)

610    FORMAT(T2,'BOLT OUT',T12,'A',T22,'IX',T32,'IY',T42,'IXY'

1,T52,'XC',T62,'YC',T72,'IO',T82,'IXIY-IXY2')

DO 310 J=1,PATN(I,1)

WRITE(08,710)J,(PATF(I,J,K),K=4,9),(PATF(I,J,K),K=12,13)

710    FORMAT(T2,I2,T10,8(1PE9.2,1X))

310    CONTINUE

300    CONTINUE

250    CONTINUE

GOTO 1000

999    WRITE(50,*)' ERROR READING THE FOLLOWING LINE:'

WRITE(50,*)REC

STOP

1000   CONTINUE

IF (IC.EQ. 1) CALL GPFB

IF (IC.EQ. 2) CALL GPFB2

WRITE(6,329)

329    FORMAT(/,/,'          ***** CALCULATING BOLT LOADS
       *****',/)
```

31

```
        WRITE(50,*)' NCASE=',NCASE,' NCMX=',NCMX

DO 401 II=1,NCASE*NCMX

II3=MOD(II,NCASE)

IF(II3 .EQ. 0) II3=NCASE

IF(LREAD(II3) .LT. 1) GOTO 401

WRITE(50,340)ICASE(II3)

340     FORMAT(' CALCULATION OF BOLT LOADS FOR CASE ',A20)

AC=ICASE(II3)

DO 401 JID=1,99

IF( JTDA(JID,1,1) .NE. 0) THEN

LOAD(1) = JTLD(II3,JID,1)

LOAD(2) = JTLD(II3,JID,2)

LOAD(3) = JTLD(II3,JID,3)

LOAD(4) = JTLD(II3,JID,4)

LOAD(5) = JTLD(II3,JID,5)

LOAD(6) = JTLD(II3,JID,6)

WRITE(50,*)JTDA(JID,1,1),(LOAD(IL),IL=1,6)

CALL BLOAD

ENDIF

401     CONTINUE
```

32

```
        CALL DATE(DD)

CALL TIME(TT)

WRITE(8,695)DD,TT

WRITE(8,786)FT07

DO 689 IFL=1,30

IF(FTXX(IFL)(1:5).NE.'     ')THEN

WRITE(8,788)FTXX(IFL)

ENDIF

689     CONTINUE

WRITE(8,696)

DO 694  JID = 1,100

IF(JTDA(JID,1,1).NE.0) THEN

WRITE(8,697)JID,JTDA(JID,1,1),ICASE(INT(CRP(JID,2)))

1,INT(CRP(JID,11)),'P=',CRP(JID,1),(CRP(JID,K),K=3,8)

WRITE(8,697)JID,JTDA(JID,1,1),ICASE(INT(CRV(JID,2)))

1,INT(CRV(JID,11)),'V=',CRV(JID,1),(CRV(JID,K),K=3,8)

ENDIF

694     CONTINUE

WRITE(8,795)DD,TT

WRITE(8,786)FT07
```

33

```
786   FORMAT('  First F06 File Name == ',A80)

DO 789 IFL=1,30

IF(FTXX(IFL)(1:5).NE.'     ')THEN

WRITE(8,788)FTXX(IFL)

788   FORMAT('  Added F06 Loads File Names == ',A80)

ENDIF

789   CONTINUE

WRITE(8,796)

DO 794  JID = 1,100

IF(JTDA(JID,1,1).NE.0) THEN

WRITE(8,799)JID,JTDA(JID,1,1),ICASE(INT(CRPF(JID,2)))

1,INT(CRPF(JID,12))

2,INT(CRPF(JID,11)),'P=',CRPF(JID,1),(CRPF(JID,K),K=3,8)

ENDIF

794   CONTINUE

695   FORMAT('1'///,' CRITICAL NOMINAL BOLT LOADS SUMMARY'

1,'    ** BANG V1.6b **',5X,A10,3X,A10,//)

696   FORMAT(/,T2,'JOINT-GRID',T16,'CRIT',T34,'BOLT'

1,T49,'CRITICAL',T70,' TX',T79,' TY',T88,' TZ',T97,' MX'

2,T106,' MY',T115,' MZ'
```

34

```
        3,/,T16,'CASE',T49,'P OR V')

697     FORMAT(BN,T2,I2,'-',I7,T16,A20,T34,I2

1,T45,A2,T47,F8.1,T65,6(1X,F8.0))

795     FORMAT('1'///,' CRITICAL FAILSAFE BOLT LOADS SUMMARY'

1,'   ** BANG V1.6b  **',5X,A10,3X,A10,//)

796     FORMAT(/,T2,'JOINT-GRID',T16,'CRITICAL',T34,'BOLT',T41,'BOLT'

1,T51,'CRITICAL',T70,' TX',T79,' TY',T88,' TZ',T97,' MX'

2,T106,' MY',T115,' MZ'

3,/,T16,'CASE',T41,'OUT',T51,'P OR V')

799     FORMAT(BN,T2,I2,'-',I7,T16,A20,T35,I2,T41,I2

1,T49,A2,T51,F8.1,T65,6(1X,F8.0))

36      RETURN

END

SUBROUTINE PATTERN

INCLUDE 'BANGCOMMON.FOR'

DO 100 J=1,NP

NB=INT(PATN(J,1))

WRITE(50,*)' # BOLT=',NB,' FOR PATTERN ',J

DO 200 I=1,NB

A(J,I)=3.14159*PATF(J,I,3)**2/4.
```

35

```
        PATN(J,2)=A(J,I)+PATN(J,2)

200     CONTINUE

DO 300 I=1,NB

X(I)=PATF(J,I,1)*A(J,I)/PATN(J,2)

PATN(J,6)=X(I)+PATN(J,6)

Y(I)=PATF(J,I,2)*A(J,I)/PATN(J,2)

PATN(J,7)=Y(I)+PATN(J,7)

300     CONTINUE

DO 400 I=1,NB

XC(J,I)=PATF(J,I,1)-PATN(J,6)

YC(J,I)=PATF(J,I,2)-PATN(J,7)

400     CONTINUE

DO 500 I=1,NB

PATN(J,4)=PATN(J,4)+XC(J,I)**2*A(J,I)

PATN(J,3)=PATN(J,3)+YC(J,I)**2*A(J,I)

PATN(J,5)=PATN(J,5)+XC(J,I)*YC(J,I)*A(J,I)

500     CONTINUE

PATN(J,8)=PATN(J,3)+PATN(J,4)

PATN(J,9)=PATN(J,3)*PATN(J,4)-PATN(J,5)**2

DO 600 K=1,NB
```

36

```
      DO 210 I=1,NB
      IF(I.NE.K)THEN
      PATF(J,K,4)=A(J,I)+PATF(J,K,4)
      ENDIF
210   CONTINUE
      DO 310 I=1,NB
      IF(I.EQ.K)THEN
      X(I)=0.
      Y(I)=0.
      ELSE
      X(I)=PATF(J,I,1)*A(J,I)/PATF(J,K,4)
      Y(I)=PATF(J,I,2)*A(J,I)/PATF(J,K,4)
      ENDIF
      PATF(J,K,8)=X(I)+PATF(J,K,8)
      PATF(J,K,9)=Y(I)+PATF(J,K,9)
310   CONTINUE
      DO 410 I=1,NB
      XCF(J,I,K)=PATF(J,I,1)-PATF(J,K,8)
      YCF(J,I,K)=PATF(J,I,2)-PATF(J,K,9)
410   CONTINUE
```

37

```
        DO 510 I=1,NB

IF(I.NE.K)THEN

PATF(J,K,6)=PATF(J,K,6)+XCF(J,I,K)**2*A(J,I)

PATF(J,K,5)=PATF(J,K,5)+YCF(J,I,K)**2*A(J,I)

PATF(J,K,7)=PATF(J,K,7)+XCF(J,I,K)*YCF(J,I,K)*A(J,I)

ENDIF

510     CONTINUE

PATF(J,K,12)=PATF(J,K,5)+PATF(J,K,6)

PATF(J,K,13)=PATF(J,K,5)*PATF(J,K,6)-PATF(J,K,7)**2

600     CONTINUE

DO 710 I=1,NB

PATS(J,2)=A(J,I)*PATF(J,I,14)+PATS(J,2)

710     CONTINUE

DO 720 I=1,NB

X(I)=PATF(J,I,1)*A(J,I)*PATF(J,I,14)/PATS(J,2)

PATS(J,6)=X(I)+PATS(J,6)

Y(I)=PATF(J,I,2)*A(J,I)*PATF(J,I,14)/PATS(J,2)

PATS(J,7)=Y(I)+PATS(J,7)

720     CONTINUE

DO 730 I=1,NB
```

38

```
         XCS(J,I)=PATF(J,I,1)-PATS(J,6)

YCS(J,I)=PATF(J,I,2)-PATS(J,7)

730      CONTINUE

DO 740 I=1,NB

PATS(J,4)=PATS(J,4)+XCS(J,I)**2*A(J,I)*PATF(J,I,14)

PATS(J,3)=PATS(J,3)+YCS(J,I)**2*A(J,I)*PATF(J,I,14)

PATS(J,5)=PATS(J,5)+XCS(J,I)*YCS(J,I)*A(J,I)*PATF(J,I,14)

740      CONTINUE

PATS(J,8)=PATS(J,3)+PATS(J,4)

PATS(J,9)=PATS(J,3)*PATS(J,4)-PATS(J,5)**2

100      CONTINUE

RETURN

END

SUBROUTINE BLOAD

INCLUDE 'BANGCOMMON.FOR'

WRITE(12,*)' THE EXTERNAL LOADS BEFORE AND AFTER'

1,' ROTATION AND FINALLY AFTER OFFSET ARE:'

WRITE(12,303)

303      FORMAT(T02,'CASE',T25,' GRID',T35,' TX',T47,' TY',T59,' TZ'
        2,T71,' MX',T83,' MY',T95,' MZ')
```

39

```
      WRITE(12,315)AC,JTDA(JID,1,1),(LOAD(K),K=1,6)

315   FORMAT(T02,A20,T25,I7,T35,6(1X,F11.2))

CALL ROTATE

WRITE(12,315)AC,JTDA(JID,1,1),(LOAD(K),K=1,6)

CALL OFFSET

WRITE(12,315)AC,JTDA(JID,1,1),(LOAD(K),K=1,6)

WRITE(12,*)' NOMINAL CASE BOLT LOADS'

WRITE(12,305)

305   FORMAT(T2,'JOINT-GRID',T16,'BOLT',T22,'      ',T32,'  '
     1,T42,'VX',T52,'VY',T62,'VR',T72,'P',/,T22,'      ')

IP=JTDA(JID,1,2)

N=INT(PATN(IP,1))

SLD6=LOAD(6)-LOAD(1)*(PATN(IP,7)-PATS(IP,7))
     1+LOAD(2)*(PATN(IP,6)-PATS(IP,6))

DO 100 IN=1,N

IF(PATF(IP,IN,14).EQ.0.)THEN

BLD(IN,1)=0.

BLD(IN,2)=0.

BLD(IN,3)=0.

ELSE
```

```
                                    40
       BLD(IN,1)=(LOAD(1)/PATS(IP,2)-SLD6*YCS(IP,IN)

1/PATS(IP,8))*A(IP,IN)

BLD(IN,2)=(LOAD(2)/PATS(IP,2)+SLD6*XCS(IP,IN)

1/PATS(IP,8))*A(IP,IN)

BLD(IN,3)=SQRT(BLD(IN,1)**2+BLD(IN,2)**2)

ENDIF

BLD(IN,4)=(LOAD(3)/PATN(IP,2)

1+(LOAD(4)*PATN(IP,4)+LOAD(5)*PATN(IP,5))*YC(IP,IN)/PATN(IP,9)

1-(LOAD(5)*PATN(IP,3)+LOAD(4)*PATN(IP,5))*XC(IP,IN)/PATN(IP,9)

2)*A(IP,IN)

WRITE(12,115)JID,JTDA(JID,1,1),IN,(BLD(IN,K),K=1,4)
115    FORMAT(T2,I2,'-',I7,T16,I3

1,T42,F9.2,T52,F9.2,T62,F9.2,T72,F9.2)

IF(ABS(BLD(IN,3)).GT.ABS(CRV(JID,1)))THEN

CRV(JID,11)=IN

CRV(JID,1)=ABS(BLD(IN,3))

CRV(JID,2)=II3

DO 80 K=1,6
80     CRV(JID,K+2)=LOAD(K)

ENDIF
```

41

```
       IF(ABS(BLD(IN,4)).GT.ABS(CRP(JID,1)))THEN

CRP(JID,11)=IN

CRP(JID,1)=ABS(BLD(IN,4))

CRP(JID,2)=II3

DO 85 K=1,6

85     CRP(JID,K+2)=LOAD(K)

ENDIF

100    CONTINUE

WRITE(12,*)' FAILSAFE CASE BOLT LOADS'

WRITE(12,105)

105    FORMAT(T2,'JOINT-GRID',T16,'BOLT',T22,'BOLT'
      1,T42,'P',/,T22,'OUT')

IP=JTDA(JID,1,2)

N=PATN(IP,1)

DO 200 IN=1,N

DO 200 IO=1,N

IF(IN.EQ.IO)THEN

BLF(IN,IO,1)=0.

BLF(IN,IO,2)=0.

BLF(IN,IO,3)=0.
```

42

```
BLF(IN,IO,4)=0.

ELSE

IF(PATF(IP,IO,4).EQ.0)THEN

WRITE(12,*)' IP=',IP,' IOUT=',IO,' A=',PATF(IP,IO,4)

ENDIF

IF(PATF(IP,IO,12).EQ.0)THEN

WRITE(12,*)' IP=',IP,' IOUT=',IO,' IO=',PATF(IP,IO,12)

ENDIF

SLD4=LOAD(4)+LOAD(3)*(PATN(IP,7)-PATF(IP,IO,9))

SLD5=LOAD(5)-LOAD(3)*(PATN(IP,6)-PATF(IP,IO,8))

SLD6=LOAD(6)-LOAD(1)*(PATN(IP,7)-PATF(IP,IO,9))
1+LOAD(2)*(PATN(IP,6)-PATF(IP,IO,8))

BLF(IN,IO,1)=(LOAD(1)/PATF(IP,IO,4)-SLD6*YCF(IP,IN,IO)
1/PATF(IP,IO,12))*A(IP,IN)

BLF(IN,IO,2)=(LOAD(2)/PATF(IP,IO,4)+SLD6*XCF(IP,IN,IO)
1/PATF(IP,IO,12))*A(IP,IN)

BLF(IN,IO,3)=SQRT(BLF(IN,IO,1)**2+BLF(IN,IO,2)**2)

BLF(IN,IO,4)=(LOAD(3)/PATF(IP,IO,4)
1+(SLD4*PATF(IP,IO,6)+SLD5*PATF(IP,IO,7))
2*YCF(IP,IN,IO)/PATF(IP,IO,13)
```

```
                                 43
       3-(SLD5*PATF(IP,IO,5)+SLD4*PATF(IP,IO,7))

4*XCF(IP,IN,IO)/PATF(IP,IO,13)

5)*A(IP,IN)

ENDIF

WRITE(12,110)JID,JTDA(JID,1,1),IN,IO,BLF(IN,IO,4)

110      FORMAT(T2,I2,'-',I7,T16,I3,T22,I3,T42,F9.2)

IF(ABS(BLF(IN,IO,3)).GT.ABS(CRVF(JID,1)))THEN

CRVF(JID,1)=ABS(BLF(IN,IO,3))

CRVF(JID,2)=II3

DO 180 K=1,6

180      CRVF(JID,K+2)=LOAD(K)

CRVF(JID,12)=IN

CRVF(JID,11)=IO

ENDIF

IF(ABS(BLF(IN,IO,4)).GT.ABS(CRPF(JID,1)))THEN

CRPF(JID,1)=ABS(BLF(IN,IO,4))

CRPF(JID,2)=II3

DO 185 K=1,6

185      CRPF(JID,K+2)=LOAD(K)

CRPF(JID,12)=IN
```

44
```
       CRPF(JID,11)=IO

ENDIF

200    CONTINUE

RETURN

END

SUBROUTINE ROTATE

INCLUDE 'BANGCOMMON.FOR'

WRITE(50,*)' ENTERING ROTATE SUBROUTINE'

WRITE(50,*)' JID= ',JID

DO 100 JJ=1,3

WRITE(50,*)(TR(JID,II,JJ),II=1,3)

100    CONTINUE

DO 300 I=1,6

300    LD(I)=LOAD(I)

LT(1)=LD(1)*TR(JID,1,1)+LD(2)*TR(JID,1,2)
      1+LD(3)*TR(JID,1,3)

LT(2)=LD(1)*TR(JID,2,1)+LD(2)*TR(JID,2,2)
      1+LD(3)*TR(JID,2,3)

LT(3)=LD(1)*TR(JID,3,1)+LD(2)*TR(JID,3,2)
      1+LD(3)*TR(JID,3,3)
```

45

```
      LT(4)=LD(4)*TR(JID,1,1)+LD(5)*TR(JID,1,2)
     1+LD(6)*TR(JID,1,3)
      LT(5)=LD(4)*TR(JID,2,1)+LD(5)*TR(JID,2,2)
     1+LD(6)*TR(JID,2,3)
      LT(6)=LD(4)*TR(JID,3,1)+LD(5)*TR(JID,3,2)
     1+LD(6)*TR(JID,3,3)
      DO 400 I=1,6
400   LOAD(I)=LT(I)
      RETURN
      END
      SUBROUTINE TRANSFORM
      INCLUDE 'BANGCOMMON.FOR'
      WRITE(8,*)
      WRITE(8,*)' OFFSET AND TRANSFORMATION ANGLE DATA'
      WRITE(8,*)' ----------------------------------'
      WRITE(8,*)
      DO 100 I=1,3
      R(I)=3.141592654/180.*ANG(JID,I)
      S(I)=SIN(R(I))
100   C(I)=COS(R(I))
```

46

XR(1,1)=1.

XR(1,2)=0.

XR(1,3)=0.

XR(2,1)=0.

XR(2,2)=C(1)

XR(2,3)=+S(1)

XR(3,1)=0.

XR(3,2)=-S(1)

XR(3,3)=C(1)

YR(1,1)=C(2)

YR(1,2)=0.

YR(1,3)=-S(2)

YR(2,1)=0.

YR(2,2)=1.

YR(2,3)=0.

YR(3,1)=+S(2)

YR(3,2)=0.

YR(3,3)=C(2)

ZR(1,1)=C(3)

ZR(1,2)=+S(3)

47

```
ZR(1,3)=0.

ZR(2,1)=-S(3)

ZR(2,2)=C(3)

ZR(2,3)=0.

ZR(3,1)=0.

ZR(3,2)=0.

ZR(3,3)=1.

YXR(1,1)=YR(1,1)*XR(1,1)+YR(1,2)*XR(2,1)+YR(1,3)*XR(3,1)

YXR(2,1)=YR(2,1)*XR(1,1)+YR(2,2)*XR(2,1)+YR(2,3)*XR(3,1)

YXR(3,1)=YR(3,1)*XR(1,1)+YR(3,2)*XR(2,1)+YR(3,3)*XR(3,1)

YXR(1,2)=YR(1,1)*XR(1,2)+YR(1,2)*XR(2,2)+YR(1,3)*XR(3,2)

YXR(2,2)=YR(2,1)*XR(1,2)+YR(2,2)*XR(2,2)+YR(2,3)*XR(3,2)

YXR(3,2)=YR(3,1)*XR(1,2)+YR(3,2)*XR(2,2)+YR(3,3)*XR(3,2)

YXR(1,3)=YR(1,1)*XR(1,3)+YR(1,2)*XR(2,3)+YR(1,3)*XR(3,3)

YXR(2,3)=YR(2,1)*XR(1,3)+YR(2,2)*XR(2,3)+YR(2,3)*XR(3,3)

YXR(3,3)=YR(3,1)*XR(1,3)+YR(3,2)*XR(2,3)+YR(3,3)*XR(3,3)

TR(JID,1,1)=ZR(1,1)*YXR(1,1)+ZR(1,2)*YXR(2,1)+ZR(1,3)*YXR(3,1)

TR(JID,2,1)=ZR(2,1)*YXR(1,1)+ZR(2,2)*YXR(2,1)+ZR(2,3)*YXR(3,1)

TR(JID,3,1)=ZR(3,1)*YXR(1,1)+ZR(3,2)*YXR(2,1)+ZR(3,3)*YXR(3,1)
```

48

```
TR(JID,1,2)=ZR(1,1)*YXR(1,2)+ZR(1,2)*YXR(2,2)+ZR(1,3)*YXR(3,2)

TR(JID,2,2)=ZR(2,1)*YXR(1,2)+ZR(2,2)*YXR(2,2)+ZR(2,3)*YXR(3,2)

TR(JID,3,2)=ZR(3,1)*YXR(1,2)+ZR(3,2)*YXR(2,2)+ZR(3,3)*YXR(3,2)

TR(JID,1,3)=ZR(1,1)*YXR(1,3)+ZR(1,2)*YXR(2,3)+ZR(1,3)*YXR(3,3)

TR(JID,2,3)=ZR(2,1)*YXR(1,3)+ZR(2,2)*YXR(2,3)+ZR(2,3)*YXR(3,3)

TR(JID,3,3)=ZR(3,1)*YXR(1,3)+ZR(3,2)*YXR(2,3)+ZR(3,3)*YXR(3,3)
      WRITE(8,200)JID
200   FORMAT(' OFFSETS TRANSFORMATION ANGLES'
     1,' AND MATRICES FOR JOINT ',I3)
      WRITE(8,220)(OFF(JID,K),K=1,3)
220   FORMAT(' OFFSETS: ',T28,2(F8.2,','),F8.2)
      WRITE(8,222)(ANG(JID,K),K=1,3)
222   FORMAT(' TRANSFORMATION ANGLES: ',T28,2(F8.2,','),F8.2)
      DO 300 I=1,3
      WRITE(8,210)(TR(JID,I,J),J=1,3)
300   CONTINUE
210   FORMAT(3(2X,F8.4))
```

49

```
        RETURN

END

SUBROUTINE OFFSET

INCLUDE 'BANGCOMMON.FOR'

DO 300 I=1,6

300     LD(I)=LOAD(I)

LT(1)=LD(1)

LT(2)=LD(2)

LT(3)=LD(3)

LT(4)=LD(4)-LD(2)*OFF(JID,3)+LD(3)*OFF(JID,2)

LT(5)=LD(5)+LD(1)*OFF(JID,3)-LD(3)*OFF(JID,1)

LT(6)=LD(6)-LD(1)*OFF(JID,2)+LD(2)*OFF(JID,1)

DO 400 I=1,6

400     LOAD(I)=LT(I)

RETURN

END

SUBROUTINE GPFB

INCLUDE 'BANGCOMMON.FOR'

NJT=100

NELR=10
```

```
                                     50
         TYPE *,'      '

TYPE *,'      '

TYPE *,'         ***** PROCESSING LOADS *****'

INF=13

1        CONTINUE

DO 181 ICS=1,100

DO 181 JID=1,NJT

DO 181 KOL=2,NELR

181      LCHK(JID,KOL,ICS)=0

IF(INF.EQ.13)THEN

WRITE(6,17)FT07

WRITE(50,17)FT07

ELSEIF((INF.GT.13).AND.(FTXX(INF-13)(1:6).NE.'      '))THEN

WRITE(6,17)FTXX(INF-13)

WRITE(50,17)FTXX(INF-13)

ELSEIF((INF.GT.13).AND.(FTXX(INF-13)(1:6).EQ.'      '))THEN

GOTO 992

ENDIF

17       FORMAT(' READING LOADS FROM FILE: ',A80)

10       READ(INF,100,END=99,ERR=992)AA
```

51

```
11      IF(AA(1:1) .EQ. '1')THEN

JTIL=AA(6:85)

READ(INF,110)TS

READ(INF,120)TL,TC

DO 16 K=1,NCASE

IF (TC .EQ. ICASE(K) ) THEN

ICS=K

GOTO 10

ENDIF

16        CONTINUE

NCASE=NCASE+1

STIL(NCASE)=TS

SLBL(NCASE)=TL

ICASE(NCASE)=TC

ELSEIF (AA(43:89).EQ.
       +'G R I D  P O I N T  F O R C E  B A L A N C E') THEN

READ(INF,'(/)')

20      READ(INF,100,END=99)AA

IF(AA(1:1) .EQ. '1')GOTO 11

READ(AA,121,ERR=11,END=99)IGR,IEL,TYP,(GPF(I),I=1,6)
```

52

```
      LREAD(ICS)=1
      DO 150 JID=1,NJT
      IF(JTDA(JID,1,1).EQ.IGR)GOTO 155
      GOTO 150
155   CONTINUE
      WRITE(50,*)' GRID MATCH FOUND FOR GRID ',IGR
      DO 160 KOL=2,NELR
      IF((JTDA(JID,KOL,1).EQ.IEL).AND.(IEL.NE.0)
     1.OR.(JTDA(JID,KOL,1).LE.0))THEN
      IF((JTDA(JID,KOL,1).EQ.IEL).AND.(IEL.NE.0))THEN
      WRITE(50,*)' ELEM MATCH FOUND FOR ELEM ',IEL
      ENDIF
      I=1
      IF(INDEX(TYP,'BAR').NE.0)ITY=1
      IF(INDEX(TYP,'BEAM').NE.0)ITY=2
      IF(INDEX(TYP,'QUAD').NE.0)ITY=3
      IF(INDEX(TYP,'TRIA').NE.0)ITY=4
      IF(INDEX(TYP,'HEXA').NE.0)ITY=5
      IF(INDEX(TYP,'PENT').NE.0)ITY=6
      IF(INDEX(TYP,'APP-').NE.0)ITY=10
```

53

```
         IF(INDEX(TYP,'*TOT').NE.0)ITY=11

WRITE(50,*)' ITY= ',ITY

IF(ITY.EQ.JTDA(JID,KOL,2).AND.(ITY.NE.0))THEN

WRITE(50,*)' TYPE MATCH FOUND FOR TYPE ',TYP,' CASE ',ICS-1

WRITE(50,121)IGR,IEL,TYP,(GPF(I),I=1,6)

121      FORMAT(BN,1X,I10,4X,I10,T30,A8,T44,6(1PE13.6,2X))

LCHK(JID,KOL,ICS)=1

IF(ITY.NE.11)THEN

DO 170 N=1,6

170      JTLD(ICS,JID,N)=JTLD(ICS,JID,N)+GPF(N)

ELSEIF(ITY.EQ.11)THEN

DO 171 N=1,6

171      JTLD(ICS,JID,N)=JTLD(ICS,JID,N)-GPF(N)

ENDIF

ENDIF

ENDIF

160      CONTINUE

150      CONTINUE

GOTO 20

ENDIF
```

54

```
         GOTO 10
99       CONTINUE
             DO 180 ICS=2,NCASE
             DO 180 JID=1,NJT
             DO 180 KOL=2,NELR
             IF(JTDA(JID,KOL,2).NE.0)THEN
             IF(LREAD(ICS).EQ.1)THEN
             IF(LCHK(JID,KOL,ICS).EQ.0) THEN
             WRITE(6,*)' IN LOAD CASE ',ICASE(ICS)
             WRITE(6,*)' NO LOADS DATA WERE FOUND FOR JOINT ',JID
            1,' ,ELEMENT ',JTDA(JID,KOL,1)
             STOP
             ENDIF
             ENDIF
             ENDIF
180      CONTINUE
             INF=INF+1
         GOTO 1
992      RETURN
100      FORMAT(A132)
```

55

```
110     FORMAT(5X,A80)

120     FORMAT(5X,A80,T110,A20)

200
FORMAT(5X,I8,T17,2F14.0,1X,2F14.0,1X,2F14.0,1X,F14.0,1X,F14.0)

210     FORMAT(4X,I7)

230     FORMAT(28X,2(1X,2F14.0),2F15.0)

220     FORMAT(T14,I6,3X,F5.0)

END

SUBROUTINE GPFB2

INCLUDE 'BANGCOMMON.FOR'

INTEGER IGPF(6)

NJT=100

NELR=10

TYPE *,'         '

TYPE *,'         '

TYPE *,'         ***** PROCESSING LOADS *****'

IGR=MGR

INF=13

1       CONTINUE

IF(INF.EQ.13)THEN

WRITE(6,17)FT07
```

56

```
         WRITE(50,17)FT07

ELSEIF((INF.GT.13).AND.(FTXX(INF-13)(1:6).NE.'      '))THEN

WRITE(6,17)FTXX(INF-13)

WRITE(50,17)FTXX(INF-13)

ENDIF

17       FORMAT(' READING LOADS FROM FILE: ',A80)

10       READ(INF,100,END=99,ERR=992)AA

11       IF(AA(1:4) .EQ. ' RUN')THEN

WRITE(50,*)' RUN CARD FOUND '

READ(AA,101,ERR=113)TC,IEL,(IGPF(I),I=1,6)

DO 90 I=1,6

90       GPF(I)=IGPF(I)

WRITE(50,*)' GPF LOADS ARE ',(GPF(I),I=1,6)

101      FORMAT(A12,4X,I8,3X,3I8,4X,3I8)

DO 16 K=1,NCASE

IF (TC .EQ. ICASE(K) ) THEN

ICS=K

GOTO 30

ENDIF

16          CONTINUE
```

57

```
          NCASE=NCASE+1

ICASE(NCASE)=TC

ICS=NCASE

30        LREAD(ICS)=1

JID=1

155       CONTINUE

DO 160 KOL=2,NELR

IF((JTDA(JID,KOL,1).EQ.IEL).AND.(IEL.NE.0))THEN

WRITE(50,*)' ELEM MATCH FOUND FOR ELEM ',IEL

DO 170 N=1,6

170       JTLD(ICS,JID,N)=JTLD(ICS,JID,N)+GPF(N)

WRITE(50,*)' CUMULATIVE LOADS FOR CASE ',ICS,' ARE:'

WRITE(50,*)(JTLD(ICS,JID,N),N=1,6)

ENDIF

160       CONTINUE

ENDIF

GOTO 10

99        CONTINUE

INF=INF+1

GOTO 1
```

58

```
992    RETURN

113    WRITE(50,*)TC,IEL,(IGPF(I),I=1,6)

WRITE(6,*)' ERROR READING LIS FILE CARD:'

WRITE(6,*)AA

STOP

100    FORMAT(A132)

110    FORMAT(5X,A80)

120    FORMAT(5X,A80,T110,A20)

200
FORMAT(5X,I8,T17,2F14.0,1X,2F14.0,1X,2F14.0,1X,F14.0,1X,F14.0)

210    FORMAT(4X,I7)

230    FORMAT(28X,2(1X,2F14.0),2F15.0)

220    FORMAT(T14,I6,3X,F5.0)

END

SUBROUTINE OPEN2

CHARACTER*80 OUTF,OUT2F,NAS

INCLUDE 'BANGCOMMON.FOR'

NF=13

IF1=0

IF2=0

IF6=0
```

59
```
DO 100 I=1,10000

READ(97,200,END=1000)REC

IF(REC(1:4).EQ.'GRID')THEN

READ(REC,220)MGR

ELSEIF(REC(1:3).EQ.'FBR')THEN

IC=2

NCMX=1

READ(REC,210)NAS

OPEN (UNIT=NF,FILE=NAS,SHARED,READONLY,STATUS='OLD')

IF(NF.EQ.13)FT07=NAS

IF(NF.GT.13)FTXX(NF-13)=NAS

NF=NF+1

IF6=1

ELSEIF(REC(1:3).EQ.'F06')THEN

IC=1

NCMX=1

READ(REC,210)NAS

OPEN (UNIT=NF,FILE=NAS,SHARED,READONLY,STATUS='OLD')

IF(NF.EQ.13)FT07=NAS

IF(NF.GT.13)FTXX(NF-13)=NAS
```

```
                              60
       NF=NF+1

IF6=1

ELSEIF(REC(1:4).EQ.'OUT ')THEN

IF1=1

READ(REC,210)OUTF

OPEN (UNIT=8,FILE=OUTF,
     .       STATUS='NEW',SHARED,CARRIAGECONTROL='FORTRAN')

ELSEIF(REC(1:4).EQ.'OUT2')THEN

IF2=1

READ(REC,210)OUT2F

OPEN (UNIT=12,FILE=OUT2F,
     .       STATUS='NEW',SHARED,CARRIAGECONTROL='FORTRAN')

ENDIF
100    CONTINUE

1000   REWIND 97

200    FORMAT(A80)

210    FORMAT(8X,A80)

220    FORMAT(8X,I8)

RETURN

END
```

61

File BANGCOMMON.FOR

```
CHARACTER *1 DOT,FT11,FT15,FT18,OBRKT,CBRKT,RESP,FORCE,LOG

CHARACTER *80 FT07,FT08,FT12,FT09,FT17,TEMP,FT16,FT19,FT20

CHARACTER*80 FTXX(30)

CHARACTER AA*132,LINE*132,DD*10,TT*8

CHARACTER TS*80,TL*80,TC*20

CHARACTER AE*1,AC*20,SH*7,END*8

CHARACTER GEOF*80,LENG*80

CHARACTER JTIL*80,STIL*80,SLBL*80,ICASE*20

CHARACTER*132 REC,FREC,TYP*8,ET*8

INTEGER FLEN

INTEGER *4 IDBRR_ADD,LIB$GET_VM,STATUS_XLN,XLN_ADD

INTEGER *4 IDBR_DIM,XLN_DIM,IDPR_DIM,PBAR_DIM

INTEGER *4 IDMAT_ADD,PMAT_ADD,STATUS_IDMAT,STATUS_PMAT

INTEGER *4 IDMAT_DIM,PMAT_DIM

INTEGER *4 NBR,NPR,NMAT,STATUS_IDBR,STATUS_IDBRR,IDBR_ADD

INTEGER *4 STATUS_BARLD,BARLD_DIM,BARLD_ADD

INTEGER *4 STATUS_IDPR,STATUS_PBAR,IDPR_ADD,PBAR_ADD

INTEGER JTDA(100,11,2),OCASE,LCHK(100,11,100)

REAL CRV(5000,11),CRP(5000,11),CRVF(5000,12),CRPF(5000,12)
```

62

```
      REAL
IY(30),IXY(30),LOAD(6),BLD(30,4),BLF(30,30,4),BAR(5000,5)
      REAL LD(6),LT(6),TR(100,3,3)

REAL MFCY,MXLN,NGEOM,I1,I2,JTOR,I1B,I2B,JTORB

REAL OFF(100,3),ANG(100,3),JTLD(900,100,6),GPF(6)

REAL PATF(100,30,14),PATN(100,9),XC(100,30),XCF(100,30,29)

REAL R(3),XR(3,3),YR(3,3),ZR(3,3),S(3),C(3),YXR(3,3)

REAL PATS(100,9),BLDC(50,30,4),BLFC(50,30,30,4)

REAL XCS(100,30),YCS(100,30)

REAL YC(100,30),YCF(100,30,29),X(30),Y(30),A(100,30),IX(30)

COMMON /IOMOD/SFACT,FORCE,RESP,LOG

COMMON/LOAD/NCASE,JTIL,STIL(900),SLBL(900),ICASE(900),LREAD(900)
      COMMON /LOAD1/NCMX

COMMON/BLOAD/IN,IO,COMB,OFF,ANG

COMMON/CRIT/CRV,CRP,CRVF,CRPF

COMMON/GPFB/JTDA,JTLD,MGR

COMMON/LD/LOAD,BLD,BLF,JID,IP,ICN,ICF,II3,BAR,AC,TR,NJT

COMMON/PAT/NP,NCN,PATF,PATN,PATS,XC,XCF,YC,YCF,XCS,YCS,A

COMMON/FTXX/FTXX

COMMON/FLAG/IF1,IF2,IF6,FT07,IC,LCHK
```

What is claimed is:

1. A computer system for determining forces acting on fasteners forming a joint in a structural system having a grid point included in one of a plurality of structural members, wherein each of the members contributes to a global force and a global moment acting at the grid point, the computer system comprising:

global means for determining said global force and said global moment, with said global force and said global moment being defined in a global coordinate system having an origin at the grid point;

means for transforming said global force and said global moment into a local force and a local moment defined by a local coordinate system;

means for translating said local force and said local moment from the grid point to a pattern centroid located at the joint;

nominal means for calculating a nominal axial force and a nominal shear force acting on each of the fasteners for a nominal case wherein all of the fasteners are operative;

fail-safe means for calculating fail-safe forces acting axially on each of the fasteners for fail-safe cases wherein each of the fasteners, one at a time, is assumed to transfer an axial force equal to zero, and said fail-safe force comprises a resultant axial force on each of the fasteners remaining operative; and announcing means for announcing characteristics of suitable fasteners, the characteristics comprising the nominal axial forces and nominal shear forces that the fasteners can withstand without failure.

2. A computer system as defined in claim 1 wherein each of the members respectively causes a partial force and partial moment at the grid point, said global means further includes:

superposition means for superimposing said partial forces and said partial moments at the grid point.

3. A computer system as defined in claim 2 further comprising:

means for obtaining said partial forces and said partial moments at the grid point from output data generated by a computer programmed with a NASTRAN computer program.

4. A computer system as defined in claim 3 further comprising:

means for determining a critical nominal axial force comprised of the highest of said nominal axial forces, and a critical nominal axial fastener transmitting said critical nominal axial force;

means for determining a critical nominal shear force comprised of the highest of said nominal shear forces, and a critical nominal shear fastener transmitting said critical nominal shear force; and means for determining a critical fail-safe force comprised of the highest of said fail-safe forces, and a critical fail-safe fastener transmitting said critical fail-safe force.

5. A computer system as defined in claim 4 wherein:

said nominal means and said fail-safe means both use said local force and said local moment acting at said pattern centroid to make their respective calculations.

6. A computer system as defined in claim 5 wherein each of the fasteners has a diameter, and a pattern is formed by the fasteners, said computer system further comprising:

means for calculating said pattern centroid based upon said pattern and said diameters.

7. A computer system as defined in claim 6, further comprising:

means for displaying said critical nominal axial force and identifying which one of the fasteners is said critical nominal axial fastener;

means for displaying said critical nominal shear force and identifying which one of the fasteners is said critical nominal shear fastener; and means for displaying said critical fail-safe force and identifying which one of the fasteners is said critical fail-safe fastener.

8. A computer system as defined in claim 7 further comprising:

the grid point being one of a plurality of grid points; and the grid point lying nearer to the joint than any other of the plurality of grid points.

9. A computer program for determining forces acting on fasteners forming a joint in a structural system having a grid point included in one of a plurality of structural members, wherein each of the structural members contributes to a global force and a global moment acting at the grid point, the computer program containing program instructions for:

determining said global force and said global moment, with said global force and said global moment bring defined in a global coordinate system having an origin at the grid point;

transforming said global force and said global moment into a local force and a local moment defined by a local coordinate system;

translating said local force and said local moment from the grid point to a pattern centroid located at the joint;

calculating a nominal axial force and a nominal shear force acting on each of the fasteners for a nominal case wherein all of the fasteners are operative;

calculating fail-safe forces acting axially on each of the fasteners for each of a plurality of fail-safe cases in which a different one of the fasteners is assumed to be inoperative and therefore to transfer an axial force equal to zero, wherein, for each of said fail-safe cases, said fail-safe force comprises a resultant axial force on each of the fasteners remaining operative; and directing the computer systems to announce characteristics of suitable fasteners, the characteristics comprising the nominal axial forces and nominal shear forces that the fasteners can withstand without failure.

10. The computer program as set forth in claim 9, wherein each of the members respectively causes a partial force and a partial moment at the grid point, the computer program further contains:

program instructions for superimposing said partial forces and said partial moments at the grid point.

11. The computer program as set forth in claim 10, wherein the computer program further contains program instructions for obtaining said partial forces and said partial moments at the grid point from output data generated by a computer programmed with a NASTRAN computer program.

12. The computer program as set forth in claim 11, wherein the computer program further contains program instructions for:

determining a critical nominal axial force comprised of the highest of said nominal axial forces, and a critical nominal axial fastener transmitting said critical nominal axial force;

determining a critical nominal shear force comprised of the highest of said nominal shear forces, and a critical nominal shear fastener transmitting said critical nominal shear force; and determining a critical fail-safe force comprised of the highest of said fail-safe forces, and a critical fail-safe fastener transmitting said critical fail-safe force.

13. The computer program as set forth in claim 12, wherein the program instructions calculate said nominal axial and shear forces and said fail-safe forces using said local force and said local moment acting at said pattern centroid.

14. The computer program as set forth is claim 13, wherein each of the fasteners has a diameter, and a pattern is formed by the fasteners, the computer program further contains:

program instructions for calculating said pattern centroid based upon said pattern and said diameters.

15. The computer program as set forth in claim 14, wherein the computer program further contains program instructions for:

displaying said critical nominal axial force and identifying which one of the fasteners is said critical nominal axial fastener;

displaying said critical nominal shear force and identifying which one of the fasteners is said critical nominal shear fastener; and displaying said critical fail-safe force and identifying which one of the fasteners is said critical fail-safe fastener.

16. The computer program as set forth in claim 15, wherein the grid point is a selected one of a plurality of grid points lying nearest to the joint.

17. A computer system for determining forces acting on fasteners forming a joint in a structural system having a grid point included in one of a plurality of structural members, wherein each of the structural members contributes to a global force and a global moment acting at the grid point, the computer system comprising:

a memory;

a processor; and a computer program stored in said memory, wherein said processor is responsive to instructions contained in said computer program for:

determining said global force and said global moment, with said global force and said global moment being defined in a global coordinate system having an origin at the grid point;

transforming said global force and said global moment into a local force and a local moment defined by a local coordinate system;

translating said local force and said local moment from the grid point to a pattern centroid located at the joint;

calculating a nominal shear force and a nominal shear force acting on each of the fasteners for a nominal case wherein all of the fasteners are operative:

calculating fail-safe forces acting axially on each of the fasteners for each of a plurality of fail-safe cases in which a different one of the fasteners is assumed to be inoperative and therefore to transfer an axial force equal to zero, wherein, for each of said fail-safe cases, said fail-safe force comprises a resultant axial force on each of the fasteners remaining operative; and directing the computer system to announce characteristics of suitable fasteners, the characteristics comprising the nominal axial forces and nominal shear forces that the fasteners can withstand without failure.

18. The computer system as set forth in claim 17, wherein each of the members respectively causes a partial force and a partial moment at the grid point, said processor is further responsive to:

the instructions contained in said computer program for superimposing said partial forces and said partial moments at the grid point.

19. The computer system as set forth in claim 18, wherein said processor is further responsive to the instructions contained in said computer program for obtaining said partial forces and said partial moments at the grid point from output data generated by a computer programmed with a NASTRAN computer program.

20. The computer system as set forth in claim 19 wherein said processor is further responsive to the instructions contained in said computer program for:

determining a critical nominal axial force comprised of the highest of said nominal axial forces, and a critical nominal axial fastener transmitting said critical nominal axial force;

determining a critical nominal shear force comprised of the highest of said nominal shear forces, and a critical nominal shear fastener transmitting said critical nominal shear force; and determining a critical fail-safe force comprised of the highest of said fail-safe forces, and a critical fail-safe fastener transmitting said critical fail-safe force.

21. The computer system as set forth in claim 20, wherein said processor calculates said nominal axial and shear forces and said fail-safe forces using said local force and said local moment acting at said pattern centroid.

22. The computer system as set forth in claim 21, wherein each of the fasteners has a diameter, and a pattern is formed by the fasteners, said processor is further responsive to:

the instructions contained in said computer program for calculating said pattern centroid based upon said pattern and said diameters.

23. The computer system as set forth in claim 22, wherein said processor is further responsive to the instructions contained in said computer program for:

displaying said critical nominal axial force and identifying which one of the fasteners is said critical nominal axial fastener;

displaying said critical nominal shear force and identifying which one of the fasteners is said critical nominal shear fastener; and displaying said critical fail-safe force and identifying which one of the fasteners is said critical fail-safe fastener.

24. The computer system as set forth in claim 23, wherein the grid point is a selected one of a plurality of grid points lying nearest to the joint.

25. A computer-readable memory containing the computer program set forth in claim 9.

26. A computer software storage medium containing the computer program set forth in claim 9.

* * * * *